United States Patent [19]
Berding

[11] Patent Number: 5,930,119
[45] Date of Patent: Jul. 27, 1999

[54] BACKPLANE HAVING REDUCED LC PRODUCT

[75] Inventor: Andrew R. Berding, Scottsdale, Ariz.

[73] Assignee: Arizona Digital, Inc., Scottsdale, Ariz.

[21] Appl. No.: 09/031,179

[22] Filed: Feb. 26, 1998

[51] Int. Cl.⁶ .................................................. H05K 1/14
[52] U.S. Cl. .................... 361/788; 361/788; 361/777; 361/803; 361/679; 361/686; 439/61; 439/59; 174/117 F; 174/117 FF; 174/268; 174/261; 174/158 R; 174/32
[58] Field of Search ..................................... 361/788, 796, 361/733, 803, 679, 686, 777, 791; 439/61, 59; 174/261, 158 R, 32, 117 FF, 117 F, 268

[56] References Cited

U.S. PATENT DOCUMENTS

| | | | |
|---|---|---|---|
| 4,362,899 | 12/1982 | Borrill | 174/36 |
| 4,738,632 | 4/1988 | Schmidt et al. | 439/341 |
| 4,879,433 | 11/1989 | Gillett et al. | 174/117 F |
| 5,365,406 | 11/1994 | Kurashima | 361/777 |
| 5,509,066 | 4/1996 | Saligny | 379/327 |
| 5,541,369 | 7/1996 | Tahara et al. | 174/268 |
| 5,568,361 | 10/1996 | Ward et al. | 361/735 |
| 5,696,667 | 12/1997 | Berding | 361/788 |
| 5,764,489 | 6/1998 | Leigh et al. | 361/777 |

*Primary Examiner*—Leo P. Picard
*Assistant Examiner*—David Foster
*Attorney, Agent, or Firm*—Paul F. Wille

[57] ABSTRACT

A data processing system includes a backplane and a plurality of logic boards connected to the backplane by a plurality of connectors. A set of common points is electrically coupled to the connectors by individual conductive traces between each common point and the corresponding pins of the connectors. The inductance of longer traces is reduced by merging traces near a central portion of the backplane to form a conductive region that extends to at least one connector on either side of the common points, thereby electrically shortening the longer traces. The inductance is further reduced by widening the longer traces. Longer traces are wider than shorter traces to reduce the differences in the LC products associated with each trace and, therefore, the differences in delay among the traces.

13 Claims, 2 Drawing Sheets

BACKPLANE HAVING REDUCED LC PRODUCT

BACKGROUND OF THE INVENTION

This invention relates to backplanes for high speed data processing systems and, in particular, to a backplane wherein the LC product of each trace is minimized It has long been recognized that the most economical and flexible construction for data processing systems is a backplane having a plurality of connectors for receiving a plurality of printed circuit boards. Each printed circuit board has electrical connections brought out to at least one edge of the board for insertion into a connector. With this construction, the configuration of a data processing system can be changed easily by adding or removing boards.

As used herein, "data processing system" refers to a group of printed circuit boards on a common backplane, wherein at least one of the boards includes digital logic circuitry. The boards can be, but need not be, identical and can include zero, one, or more microprocessors. In the art, the backplane is often referred to as a "motherboard," probably as a derivative of "breadboard." The printed circuit boards attached to the backplane are often referred to as "daughter boards" or "cards." Because of the shape of the connectors, the term "slot" is used in the art to refer to the connector itself or to refer to the position of a connector on a backplane, e.g. "slot six." There is not actually a long, narrow hole in the backplane. A plurality of traces carrying the same type of signals is known as a bus, e.g. a data bus.

The backplane itself is a printed circuit board in which the connectors are approximately parallel and, in general, each pin of each connector is electrically connected to the corresponding pin of every other connector by a conductive run or "trace" among the connectors. For example, pin one in the first connector is connected to pin one of every other connector by a trace threading its way down the length of the backplane. In the early days of the microprocessor, a single layer of traces interconnecting ten or twenty connectors was sufficient. As microprocessors became faster, this construction was no longer adequate and multi-layer sandwiches of traces became necessary.

Each microprocessor has an internal clock that synchronizes the operation of the various portions of the microprocessor, e.g. internal logic, address lines, and data lines, and defines the minimum period in which operations can take place. While not a true indicator of the speed of a microprocessor, the clock frequency provides a simple way to compare microprocessors. A greater difficulty with clock frequency is that the signals in a microprocessor are square wave pulses, not sinusoidal signals. As shown by the mathematician Fourier, a square wave of a given frequency is the sum of a sine wave of the same frequency (the fundamental) and the odd harmonics of the fundamental. Thus, the pulses in a backplane contain components of significantly higher frequency than the nominal clock frequency. The result is that the traces become transmission lines having complex, frequency dependent, impedance characteristics.

If the clock frequency is low, e.g. one megahertz, the parallel lines in a backplane exhibit some coupling, known as cross-talk, i.e. the traces act like miniature antennas, transmitting and receiving signals. This coupling is minimal and the system functions despite the distortions that the coupling introduces into the signals on the traces. Even though the traces are actually transmission lines, the traces can be considered lumped capacitances and inductances at low frequency. If, on the other hand, the clock frequency is on the order of tens of megahertz, the problems of coupling can no longer be ignored and the prior art has used a number of techniques for addressing the problem, e.g. grounding alternate traces to minimize coupling. At a clock frequency on the order of one hundred megahertz, the problems are severe and the traces must be considered transmission lines, with the attendant problems of reflections and terminations.

A square wave pulse is usually considered to have vertical edges and a constant amplitude top. In fact, this ideal is physically impossible to attain, although one can appear to approach the ideal, depending upon how closely one inspects the waveform. For example, a conductive trace of any length exhibits a nominal capacitance. The time required to charge that capacitance to a given voltage depends upon the available current. Increasing a trace from zero volts to five volts (or any voltage) in zero time requires infinite current. Thus, the leading edge and the trailing edge of any square wave pulse necessarily have a finite slope ($\Delta V/\Delta t$) and this slope limits the maximum speed of operation of a data processing system and is independent of the clock frequency. On the other hand, it is advantageous to reduce the slopes of the leading and trailing edges of a pulse to reduce the amplitude of the high frequency components of the pulse because even very short traces can radiate significant amounts of energy at very high frequencies. Reducing the slope of the leading edge and the slope of the trailing edge reduces the amount of electromagnetic interference (EMI) caused by a backplane.

A simple rule of thumb is that a trace can be considered a lumped impedance if both the rise time ($\Delta t_r$) and the fall time ($\Delta t_f$) of a pulse are longer than the round trip propagation time of the pulse. If not, the trace must be considered a complex transmission line, i.e. the capacitances and inductances are distributed along the trace and must be evaluated at a plurality of points to determine the effect of the trace on a pulse traveling along the trace (and being reflected back).

At high clock frequencies, the traces on a backplane cause a delay that can become a significant fraction of a clock period. For example, a trace forty centimeters long can delay a pulse by eight to ten nanoseconds or one period of a 100 megahertz clock. The difference in the arrival times of a signal at different connectors is called skew. If all connectors are being driven by a common clock, skew can severely limit the rate at which data is transmitted between boards connected to the backplane. It is known in the art to arrange the boards in a circle to minimize path length but this configuration is difficult to construct. It is preferred to have a planar or "linear" backplane.

It is now known in the art how to address many of the foregoing difficulties. U.S. Pat. No. 5,696,667 (Berding) discloses a technique for converting the impedances of the traces into lumped impedances, with an attendant eight-fold improvement in speed over the prior art where a ten or twenty percent increase would have been welcomed. Despite this tremendous advance in the art, there are applications for which even greater speed is desirable.

The Berding patent describes a backplane in which a set of common points is electrically coupled to the connectors by individual conductive traces between each common point and the corresponding pins of the connectors. A "point" does not refer to a location of zero size but to a finite region in a conductive layer of a printed circuit board.

Compared to backplanes of the prior art, the newer construction increases the number of traces in a backplane because a single trace threading its way among the pins is replaced with a separate trace for each connector. A VME (Versa Module European) backplane typically includes twenty-one connectors. Constructed in accordance with the Berding patent, slot eleven contains the common points and there are ten connectors on either side. Thus, for each pin, there are ten traces extending from slot eleven to slot ten and from slot eleven to slot twelve. The number of traces decreases as one moves to either end of the backplane.

In the manufacture of printed circuit boards, there are a minimum line width and a minimum line spacing that limits the number of traces that can pass between a pair of pins in a connector. To satisfy the limits, one must increase the number of layers. It is difficult to produce large quantities of backplanes at high speed when the backplane contains a large number of layers. The layers of the board must be carefully aligned to assure that contact holes are drilled in the proper places. It is desired to reduce the number of traces without losing the benefit of having a lumped impedance.

It is known in the art to make a long trace wider than a short trace to compensate for the greater resistance of the long trace; e.g. U.S. Pat. No. 5,365,406 (Kurashima). U.S. Pat. No. 5,541,369 (Tahara et al.) disclose printed circuit boards in which a conductive trace increases in width with length. What is not recognized in these patents is that a wider trace has a lower inductance than a narrower trace. More specifically, in terms of a backplane constructed in accordance with the Berding patent, it has not been recognized that a wider trace can reduce the lumped inductance of a trace.

Reducing the lumped impedance of a trace reduces the amount a signal is delayed traveling along a trace. The difference in the arrival times of a signal at different connectors is called skew, which is undesirable. In the prior art, the problem of skew is addressed by making the traces of equal length; e.g. U.S. Pat. No. 4,879,433 (Gillett et al.). Unfortunately, it is not feasible to construct a backplane in accordance with the Berding patent and have traces of equal length.

In view of the foregoing, it is therefore an object of the invention to provide a backplane that is designed for high speed and that is designed for ease of manufacture.

Another object of the invention is to reduce the inductances of longer traces by increasing the width of the remote portions, i.e. portions located away from the common points, of the longer traces.

A further object of the invention is to minimize skew in a backplane for high speed data processing systems.

Another object of the invention is to minimize the LC product of the lumped impedance of each trace in a backplane for high speed data processing systems.

SUMMARY OF THE INVENTION

The foregoing objects are achieved by this invention in which a data processing system includes a backplane and a plurality of logic boards connected to the backplane by a plurality of connectors. A set of common points is electrically coupled to the connectors by individual conductive traces between each common point and the corresponding pins of the connectors. The common points are preferably centrally located among the plurality of connectors to reduce propagation delay. Portions of the longer traces are widened to decrease the inductance of the trace. The longest trace to either end of the backplane is not widened as much as possible at the end of the trace, thereby minimizing the lumped capacitance of the trace.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
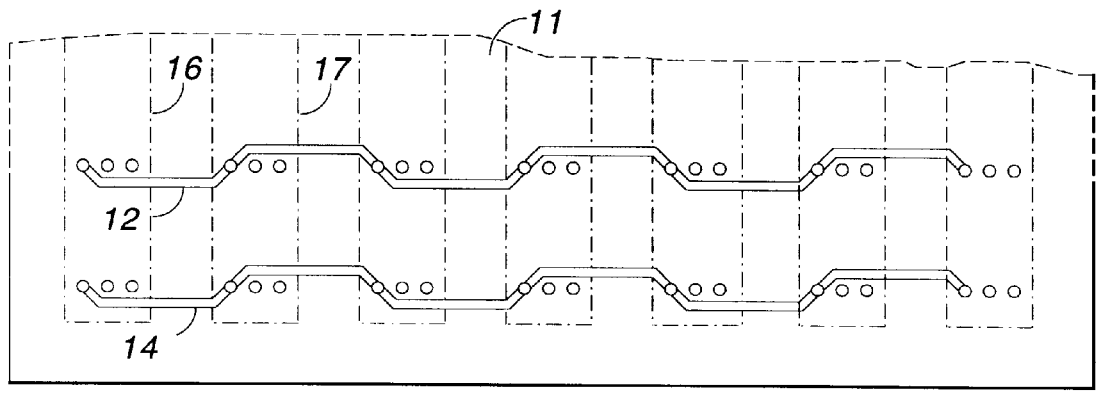
FIG. 1 illustrates a backplane constructed in accordance with the prior art.

FIG. 1 illustrates the interconnection of pins in two rows of a backplane constructed in accordance with the prior art. Backplane 11 includes conductive traces 12 and 14 interconnecting the corresponding pins of each connector, such as connectors 16 and 17. Note that the traces stitch from one connector to the next seriatim. A single trace interconnects the corresponding pins. Logic boards, not shown, are attached to the backplane by the connectors.

Figure 2:
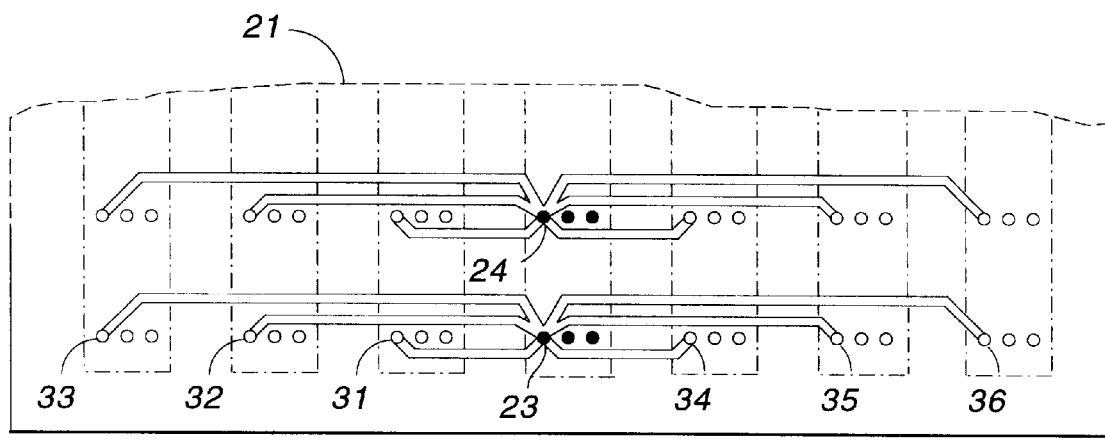
FIG. 2 illustrates a backplane constructed in accordance with the Berding patent.

FIG. 2 illustrates a backplane constructed in accordance with the Berding patent. Backplane 21 includes a plurality of connector pins arranged in an array of rows and columns, with the connector for a given board including a column three pins wide. The connectors in a current VME backplane have five columns of pins. Three columns are sufficient to illustrate the invention, which is not limited to VME backplanes. The pins for each connector can be encased in a suitable plastic or left separate. The reference to rows and columns is for the sake of convenience in describing the invention and is not intended as a constraint upon the arrangement of the pins.

In backplane 21, each pin is connected by a separate trace to a common point. For example, in the bottom row of pins, the left-hand pin of each connector is connected to common point 23 in the middle of backplane 21 by a separate trace emanating from the common point. Specifically, there is a trace from common point 23 to pin 31; there is a separate trace from common point 23 to pin 32; there is a separate trace from common point 23 to pin 33; there is a separate trace from common point 23 to pin 34; there is a separate trace from common point 23 to pin 35; there is a separate trace from common point 23 to pin 36; and so on, for all pins on all connectors. Common point 24 is connected in the same way to the left-hand pins in the second row, as are the remaining pins on the backplane that are to be connected together. (In some applications, not all pins are connected to all corresponding pins.)

Connecting the pins by individual traces that join at a common point causes the circuit to act like a simple lumped inductance and capacitance rather than as a complex transmission line. The capacitances of the traces, of the connectors, of the stubs into the boards, and of the semiconductor devices on the boards act as if they were lumped at the common point rather than being distributed along a trace. The lumped capacitance is driven through the lumped inductance of the trace from a driver board. The effective circuit is a series connected inductor and a shunt capacitor to ground at the common point.

As described in the Berding patent, the advantages of this construction are manifold. A disadvantage of this construction is the number of traces emanating from the common points. In accordance with the invention, as illustrated in FIG. 3, the number of traces is reduced without losing the advantages of a lumped impedance.

Figure 3:
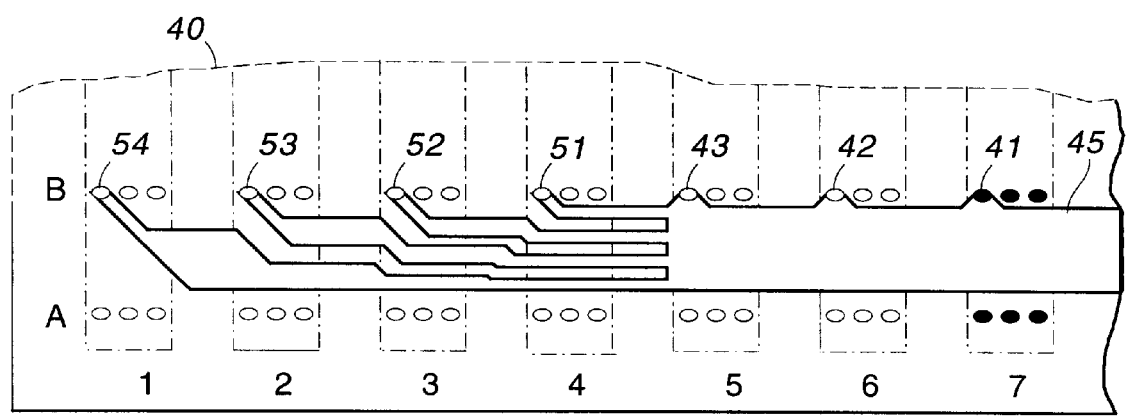
FIG. 3 illustrates a backplane constructed in accordance with the invention.

FIG. 3 illustrates the left-hand portion of a backplane having fifteen slots. Specifically, backplane 40 includes slot seven at the middle of the backplane. Unlike the Berding patent, pin 41 in slot seven is coupled to pin 42 in slot six and to pin 43 in slot five by a single trace rather than by individual traces. Trace 45 is shown greatly exaggerated in width. In a preferred embodiment of the invention, trace 45 has a width approximately equal to the width of four traces merged. The corresponding pins in slots eight and nine (not shown), to the right of slot seven, are also coupled together by trace 45.

Even though pin 42 and pin 43 (and the corresponding pins in slots eight and nine) are not coupled to pin 41 by separate traces, the advantages of a lumped impedance are not lost because trace 45 is relatively short, physically and electrically. A single, wider trace is not electrically the same as individual traces but the trade-off is a backplane that is much easier to make. For a twenty-one slot backplane, up to three connectors on either side of the common points can be interconnected with single, wider traces. Those of skill in the art will understand that the number of connectors depends upon the width and spacing of the connectors. A single, wide trace having a length less than approximately 100 mm can be used, depending upon clock speed.

This change in construction provides several important advantages over the prior art. The construction of the backplane is simplified, a lumped impedance characteristic is not lost, and the inductance of all traces coupled to common point 41 is reduced because the length of those traces is reduced. That is, pin 43 is the common point, electrically, for pins 51, 52, 53, and 54, and is closer to those pins than pin 41.

In accordance with another aspect of the invention, trace 45 splits into individual traces for coupling pins 51, 52, 53, and 54 to pin 41. This construction retains the lumped impedance characteristic of the backplane. In accordance with another aspect of the invention, the individual traces increase in width as the number of traces decreases. In slot four, there are four traces between rows A and B. In slot three, there are three traces between rows A and B and these traces are wider than they are at slot four. In slot two, there are two traces between rows A and B and these traces are wider than they are at slot three.

By increasing the width of a trace, the inductance of a trace is decreased and the capacitance of the trace is increased slightly. A decrease in inductance has several advantages. A first is a reduction in the delay of a signal propagating along the trace. (Propagation delay is proportional to $\sqrt{LC}$). The delay on an individual trace is relatively unimportant. What is important is the variation in delay among the traces, i.e. skew. If one can only control inductance and capacitance to within twenty percent, then one will probably have a twenty percent skew because of unavoidable differences among the traces. A reduced delay reduces the magnitude of the skew because one is taking twenty percent of a smaller number. Another advantage of a reduced inductance is a decrease in the rise time of the trace, i.e. an increase in bandwidth that allows a higher clock frequency to be used. Shorter rise times and fall times mean that the length at which a trace must be considered a transmission line is reduced, i.e. the invention applies to even shorter traces than before.

Changing the width of a trace affects inductance and capacitance but the change in capacitance is inconsequential compared to other variations in the capacitance of the "net," i.e. the system capacitance including everything that is connected to a common point (e.g. connector, stubs, transceivers, the mating connector). A trace may have an inductance of 50 nhy. and the backplane may have a lumped capacitance of 200–250 pf. Each board adds 10–11 pf. and the lumped capacitance can be doubled by fully loading a backplane. Thus, changes in the lumped capacitance due to increasing the width of a trace are not as significant as changes in inductance. Even so, it has been found that an arbitrarily wide trace is not necessarily desirable.

Figure 4:
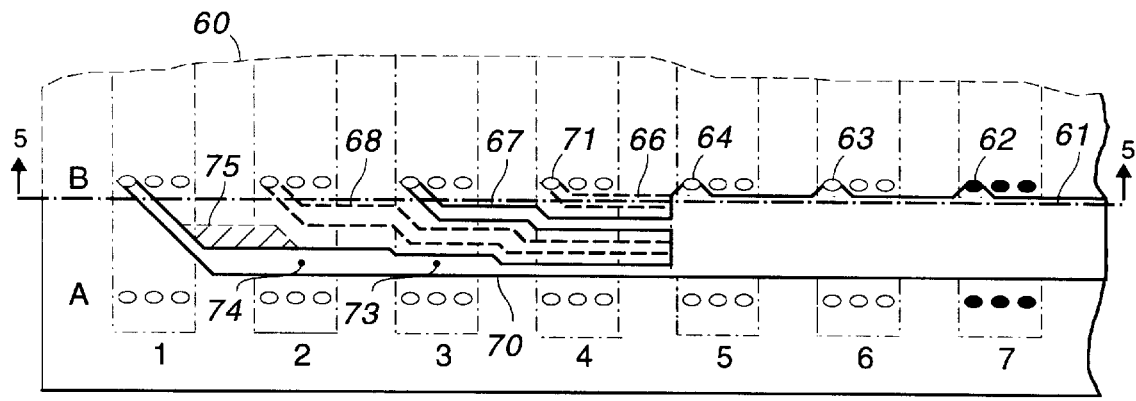
FIG. 4 illustrates a backplane constructed in accordance with an alternative embodiment of the invention.

FIG. 4 illustrates a backplane constructed in accordance with an alternative embodiment of the invention in which some compromise is made in the shorter traces for the benefit of the longer traces. In FIG. 3, the traces shared equally the space between rows of pins. In FIG. 4, the traces do not share the space equally.

Backplane 60 includes trace 61 interconnecting pins 62, 63, and 64 and separating into traces 66, 67, 68, and 70. Trace 66 has an essentially uniform width from trace 61 to pin 71. The four traces have approximately the same width crossing slot four. Between slot four and slot three, traces 67 and 68 increase slightly in width and are approximately equal in width. Trace 70, however, is wider in portion 73 than either trace 67 or trace 68. Between slot three and slot two, trace 68 increases slightly in width and trace 70 increases even more, remaining wider than trace 68. From slot two to slot one, trace 70 does not increase in width even though the trace could have included cross-hatched area 75.

FIG. 4 represents a backplane wherein the width of the traces is optimized by minimizing the LC product of each trace, wherein L is the inductance of the trace and C is the capacitance of the net. Trace 66 exhibits less inductance than trace 67 simply because trace 66 is shorter than trace 67. The same relationship applies to the other traces. By increasing the width of traces 67, 68, and 70, one reduces the difference in inductance among the traces. Specifically, trace 70 is made wider over a longer length by not widening traces 67 and 68 as much as possible. As a result, the inductance of trace 70 is not much more than the inductance of trace 68, which is not much more than the inductance of trace 67.

Trace 70 is not widened to the point that the LC product associated with trace 70 is less than the LC product associated with a shorter trace. Further, trace 70 is not widened to the point that the lumped capacitance increases the LC product despite a reduction in inductance. Finally, trace 70 does not include area 75 because an increased capacitance at the remote end of a long trace can cause ringing, which is undesirable. Thus, trace 70 is widened over as much of its length as possible but not at the end of the trace.

Applying the teachings of the invention to the backplane illustrated in FIG. 4, one sees that trace 66 is left at $\frac{1}{n}$th the available width including spaces, where n is the number of traces. Among the individual traces, trace 66 has the smallest LC product. Traces 67 and 68 are widened only slightly to provide room for a wider, longer portion of trace 70. Thus, using subscripts to denote traces and primes to denote widened traces, $LC_{70} > LC_{70}' \geq LC_{68}' \geq LC_{67}' \geq LC_{66}$.

Figure 5:
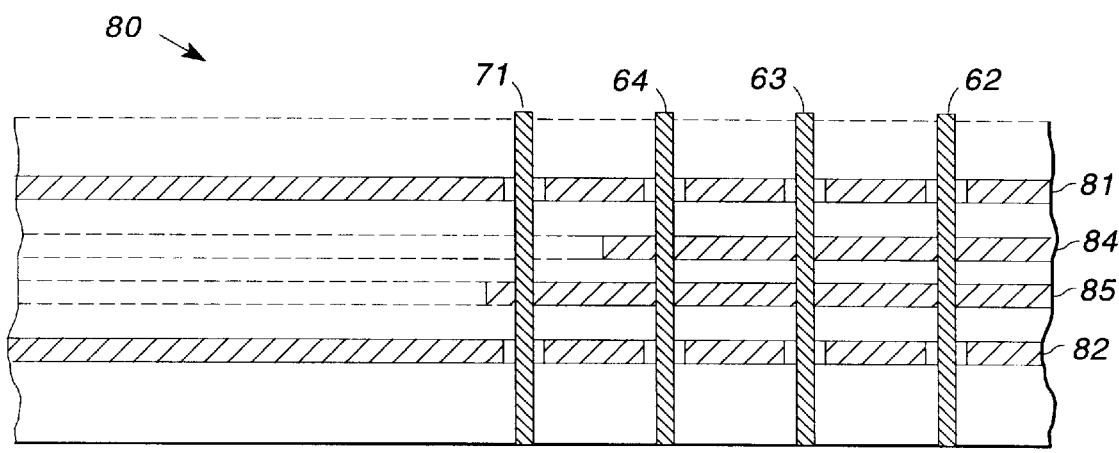
FIG. 5 is a cross-section of a backplane taken along line 5—5 in FIG. 4.

FIG. 5 is a cross-section of a backplane constructed in accordance with another aspect of the invention. Backplane 80 includes ground planes 81 and 82 and signal layers 84 and 85, all separated by insulating layers. Unlike printed circuit boards of the prior art, pairs of signal layers are adjacent to each other instead of being separated by ground planes. Trace 61 includes portions of two signal layers, connected together by pins 62, 63, and 64. Traces 66 and 68 (FIG. 4) are connected together in signal layer 85 and traces 67 and 70 (FIG. 4) are connected together in signal layer 84.

The construction illustrated in FIG. 5 provides isolation for signals on different sets pins and a large, very low (essentially zero) impedance region where the signal layers are connected together. Constructing a backplane with traces interconnecting alternate slots rather than consecutive slots and dividing the traces between two planes in a multi-layer printed circuit board puts the two longest traces on separate planes, thereby facilitating widening the remote portions of the longer traces.

In FIGS. 3 and 4, the four traces passing between the pins in rows A and B have equal width. At present, this is determined by the design rules for the printed circuit board, i.e. line width and spacing limits. If possible, in accordance with the invention, one would widen at least trace 70 along its entire length.

Printed circuit boards are typically made from glass epoxy (FR-4). There are other materials that have been used for making printed circuit boards, such as cyanide acetate, and these materials have a lower permittivity than glass epoxy. A lower permittivity is of little consequence in backplanes having traces acting as transmission lines but has the effect of further enhancing the performance of a backplane constructed in accordance with the invention. A glass epoxy board has a permittivity of about 5.0. A cyanide acetate board has a permittivity of 3.0–3.3. A lower permittivity reduces capacitance, enabling faster propagation and, therefore, enabling reduced delay, reduced skew, and shorter rise times. The improvement is proportional to the square root of the difference in permittivity. One can also reduce the separation between a signal layer and ground, which increases capacitance but reduces inductance, rise-time, skew, and cross-talk.

The invention thus provides a high speed backplane that is easier to manufacture than the high speed backplanes of the prior art because of a reduced number of traces between the pins. A common region, rather than a common point, decreases the length and the inductance of the longer traces. Increasing the width of the remote portions of the longer traces further reduces inductance, minimizing skew and increasing bandwidth by minimizing the LC product of the lumped impedance of each trace. The result is a significant improvement over the backplane described in the Berding patent.

Having thus described the invention, it will be apparent to those of skill in the art that various modifications can be made within the scope of the invention. For example, the invention can be applied to backplanes with any number of slots, although greater benefit from the invention is obtained from backplanes having more than four or five slots. It is preferred but not necessary that one employ both enhancements simultaneously, viz. merging the shorter traces and widening the remote portions of the longer traces.

What is claimed is:

1. A data processing system including a backplane and a plurality of logic boards each connected to said backplane, wherein said backplane comprises:

a plurality of connectors approximately parallel with each other for receiving said logic boards, each of said connectors having a plurality of pins;

a plurality of common points; and a plurality of conductive traces for electrically coupling a pin from each connector to one of said common points by individual traces, respectively, to cause a lumped impedance characteristic at each common point;

wherein a portion of at least one trace is wider than the remainder of the trace to reduce the product of the inductance of the trace and the capacitance of the net.

2. The data processing system as set forth in claim 1 wherein said connectors are arranged between a first end of said backplane to a second end and said common points are located approximately centrally on said backplane.

3. The data processing system as set forth in claim 2 wherein the traces to each common point in the central portion of said backplane merge to form a single trace on either side of said common point, said single trace having a length that is short relative to the rise time of a signal on the trace.

4. The data processing system as set forth in claim 2 wherein said pins are arranged in rows and columns and the columns are approximately parallel to the connectors, wherein the traces near said first end and near said second end have a width determined by the space available between said rows, whereby the longer traces increase in width to reduce the LC product of the longer traces.

5. The data processing system as set forth in claim 4 wherein a first longest trace, extending from a common point to said first end, and a second longest trace, extending from a common point to said second end, each trace has an end portion wider than the remainder of the trace but the width is less than the available width between rows, thereby minimizing the LC product of the longest traces.

6. The data processing system as set forth in claim 5 wherein, at a given connector, the width of said first longest trace is greater than the width of other traces extending between the same two rows of pins as the first longest trace.

7. The data processing system as set forth in claim 4 wherein the traces to each common point in the central portion of said backplane merge to form a single trace on either side of said common point, said single trace having a length that is short relative to the rise time of a signal on the trace.

8. A backplane for a data processing system, said backplane comprising:

(a) a printed circuit board;

(b) a plurality of connectors coupled to said printed circuit board, each connector including a plurality of pins;

(c) a plurality of elongated conductive traces disposed on the printed circuit board, each trace having a first end and a second end, the first end of each trace being electrically connected to one of said pins; and (d) a plurality of common points;

wherein the traces are grouped corresponding to the common points and each of the second ends of the traces of each group are electrically connected to the common point corresponding to that group, to cause each trace to exhibit a lumped high frequency impedance characteristic at the common point to which that trace is electrically connected; and wherein at least some traces are wider near the second end than near the first end to minimize the lumped high frequency impedances of the traces.

9. The backplane as set forth in claim 8 wherein said printed circuit board includes a plurality of conductive layers alternating with a plurality of insulating layers.

10. The backplane as set forth in claim 9 wherein traces to adjacent connectors are in separate conductive layers of said printed circuit board.

11. The backplane as set forth in claim 10 wherein the second ends of traces merge at said common points to form common regions interconnecting at least two adjacent connectors, wherein the regions split into individual traces at a location between said common points and the first ends of the traces.

12. The backplane as set forth in claim 11 wherein the common regions of two adjacent conductive layers are connected together in said printed circuit board.

13. The backplane as set forth in claim 12 wherein said printed circuit board is characterized by a permittivity less than 5.

* * * * *